United States Patent
Johnson et al.

(10) Patent No.: US 6,671,564 B1
(45) Date of Patent: Dec. 30, 2003

(54) PORTABLE PROGRAMMING SYSTEM AND CONTROL METHOD THEREFOR

(75) Inventors: Simon B. Johnson, Kirkland, WA (US); George Leland Anderson, Bothell, WA (US); Lev M. Bolotin, Kirkland, WA (US)

(73) Assignee: Data I/O Corporation, Redmond, WA (US)

( * ) Notice: Subject to any disclaimer, the term of this patent is extended or adjusted under 35 U.S.C. 154(b) by 273 days.

(21) Appl. No.: 09/678,945

(22) Filed: Oct. 3, 2000

(51) Int. Cl.[7] .................. G05B 15/02; G05B 19/18; G05B 11/01

(52) U.S. Cl. ................ 700/19; 700/3; 700/4; 700/9; 700/100; 700/121; 702/187

(58) Field of Search ................ 700/2–4, 121, 700/9, 17, 19, 83, 108–111, 100–102; 702/84, 185, 187

(56) References Cited

U.S. PATENT DOCUMENTS

| | | | | |
|---|---|---|---|---|
| 4,610,206 A | * | 9/1986 | Kubala et al. ............. 104/26.1 |
| 5,068,778 A | * | 11/1991 | Kosem et al. ................. 700/9 |
| 5,209,560 A | * | 5/1993 | Taylor et al. ................. 362/85 |
| 5,598,149 A | * | 1/1997 | Schreiter et al. ........... 340/3.52 |
| 5,682,328 A | * | 10/1997 | Roeber et al. .............. 702/187 |
| 6,055,632 A | | 4/2000 | Deegan et al. .............. 713/100 |
| 6,144,888 A | * | 11/2000 | Lucas et al. .................. 700/83 |
| 6,269,279 B1 | * | 7/2001 | Todate et al. ............... 700/121 |
| 6,370,586 B2 | * | 4/2002 | Davis et al. ................. 709/244 |
| 6,405,103 B1 | * | 6/2002 | Ryan et al. .................. 700/275 |
| 6,411,863 B1 | * | 6/2002 | Dickman .................... 700/206 |
| 6,442,446 B1 | * | 8/2002 | Nakamura et al. .......... 700/121 |
| 6,470,388 B1 | * | 10/2002 | Niemi et al. ................. 709/224 |
| 6,473,668 B2 | * | 10/2002 | Abuzeid et al. ............. 700/121 |
| 6,535,780 B1 | * | 3/2003 | Anderson et al. ........... 700/121 |
| 2002/0007227 A1 | * | 1/2002 | Prentice et al. ............. 700/121 |

FOREIGN PATENT DOCUMENTS

GB  2318664 A  4/1998  ........... G06F/17/50

* cited by examiner

*Primary Examiner*—Anil Khatri
*Assistant Examiner*—Crystal J. Barnes
(74) *Attorney, Agent, or Firm*—Mikio Ishimaru

(57) ABSTRACT

A control system and method are provided having a control agent controlling a user interface, an actuator control, a programming control, and a job control. The control system is used with a programming system which has an actuator control for opening and closing sockets and a programming mechanism for performing a programming operation on the programmable devices at a high rate of speed.

16 Claims, 3 Drawing Sheets

PORTABLE PROGRAMMING SYSTEM AND CONTROL METHOD THEREFOR

CROSS-REFERENCE TO RELATED APPLICATION(S)

The present application contains subject matter related to co-pending U.S. patent application Ser. No. 09/418,732, now U.S. Pat. No. 6,532,395 B1, by Lev M. Bolotin entitled "MANUFACTURING SYSTEM WITH FEEDER/PROGRAMMING/BUFFER SYSTEM". The related application is assigned to Data I/O Corporation, and is hereby incorporated by reference.

The present application also contains subject matter related to co-pending U.S. patent application Ser. No. 09/419,172, now U.S. Pat. No. 6,449,523 B1, by Bradley M. Johnson, Lev M. Bolotin, Simon B. Johnson, Carl W. Olson, Bryan D. Powell, and Janine Whan-Tong, entitled "FEEDER/PROGRAMMING/BUFFER OPERATING SYSTEM". The related application is assigned to Data I/O Corporation, and is hereby incorporated by reference.

The present application further contains subject matter related to co-pending U.S. patent application Ser. No. 09/418,901 by Simon B. Johnson, George L. Anderson, Lev M. Bolotin, Bradley M. Johnson, Mark S. Knowles, Carl W. Olson, and Vincent Warhol, entitled "FEEDER/PROGRAMMING/BUFFER CONTROL SYSTEM AND CONTROL METHOD". The related application is assigned to Data I/O Corporation, and is hereby incorporated by reference.

The present application still further contains subject matter related to co-pending U.S. patent application Ser. No. 09/419,162 by Lev M. Bolotin entitled "MANUFACTURING AND CARRIER SYSTEM WITH FEEDER/PROGRAMMING/BUFFER SYSTEM". The related application is assigned to Data I/O Corporation, and is hereby incorporated by reference.

The present application further contains subject matter related to a concurrently filed U.S. patent application Ser. No. 09/632,895 by Lev M. Bolotin entitled "FEEDER/PROGRAMMING/FEEDER SYSTEM". The related application is assigned to Data I/O Corporation, and is hereby incorporated by reference.

TECHNICAL FIELD

The present invention relates generally to a manufacturing system for electronic products, and more particularly to a programming system for microdevices.

BACKGROUND ART

In the past, programmable microdevices were programmed in a standalone, single socket, programming system. An operator would manually place individual unprogrammed micro devices in the programmer for programming, and then remove them for placement on a carrier. The operator would also place rejected microdevices, which did not meet specifications or which could not be programmed, into reject bins. The programmed microdevices, which were not rejected, would be placed on the carrier and placed in an input feeder, which would be attached to an assembly line. The assembly line had its own assembly line handling system which would pick up the programmed microdevices and place them on printed circuit boards.

One of the problems associated with the prior art programming equipment is that it lacks a control system which is capable of comprehensively job managing and controlling the programming operation. Another problem with the prior art programming equipment is that it typically does not allow for easy communication between the programming equipment and other computers.

Ideally, a programming system would have a control system that efficiently manages and controls the programming operations and is capable of maintaining and communicating essential operation information, such as equipment uptime, yield, number of failures, the types of failure, etc., to and from other computers through a storage media or a network arrangement. This ideal has been extremely difficult to achieve and has eluded those skilled in the art.

DISCLOSURE OF THE INVENTION

The present invention provides a control system having a control agent controlling a user interface, an actuator control, a processing control, and a job control. The control system is used with a processing system which has a processing mechanism for performing a processing operation on the microdevices at a high rate of speed.

The present invention further provides a control agent controlling a plurality of subsystems. The control agent is used with a processing system which has an actuator mechanism for manipulating the microdevices among the other mechanisms, and a processing mechanism for performing a processing operation on the microdevices at a high rate of speed.

The present invention further provides a control agent controlling an error manager subsystem. The error manager subsystem is used for efficiently managing errors in a processing system which has an actuator mechanism for opening and closing sockets and a processing mechanism for performing a processing operation on the microdevices at a high rate of speed.

The present invention further provides a control agent controlling an event log subsystem. The event log subsystem is used for maintaining a history log of the operations of a processing system which has an actuator mechanism for opening and closing sockets and a processing mechanism for performing a processing operation on the microdevices at a high rate of speed.

The present invention further provides a control agent controlling a non-volatile memory subsystem. The non-volatile memory subsystem is used for maintaining operation information across power cycles regarding a processing system which has an actuator mechanism for opening and closing sockets and a processing mechanism for performing a processing operation on the microdevices at a high rate of speed.

The present invention further provides a control agent controlling a programmable memory subsystem. The programmable memory subsystem is used for updating operation information regarding a processing system which has an actuator mechanism for manipulating the microdevices among the other mechanisms, and a processing mechanism for performing a processing operation on the microdevices at a high rate of speed.

The present invention further provides a control agent controlling a communications network subsystem. The communications network subsystem is used for communicating information to and regarding a processing system which has an actuator mechanism for manipulating the microdevices among the other mechanisms, and a processing mechanism for performing a processing operation on the microdevices at a high rate of speed.

The present invention further provides a control agent controlling a portable memory manager. The portable memory manager uses a PCMCIA card and is used for updating operation information regarding a processing system which has an actuator mechanism for opening and closing sockets and a processing mechanism for performing a processing operation on the microdevices at a high rate of speed.

The above and additional advantages of the present invention will become apparent to those skilled in the art from a reading of the following detailed description when taken in conjunction with the accompanying drawings.

BEST MODE FOR CARRYING OUT THE INVENTION

Organization

Figure 1:
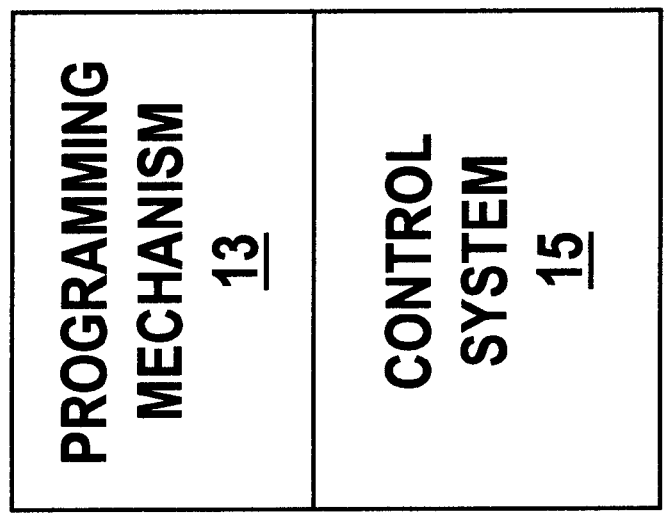
FIG. 1 is a side view of a programming system of the present invention.

Referring now to FIG. 1, therein is shown a programming system 10. The programming system 10 includes a programming mechanism 13 for programming the programmable devices, and a control system 15 for controlling the operation of the programming system 10. The programming system 10 includes a plurality of programmer sockets (not shown) into which unprogrammed microdevices are placed by a user. However, any system having similar mechanisms for performing similar functions could incorporate the present invention.

Figure 2:
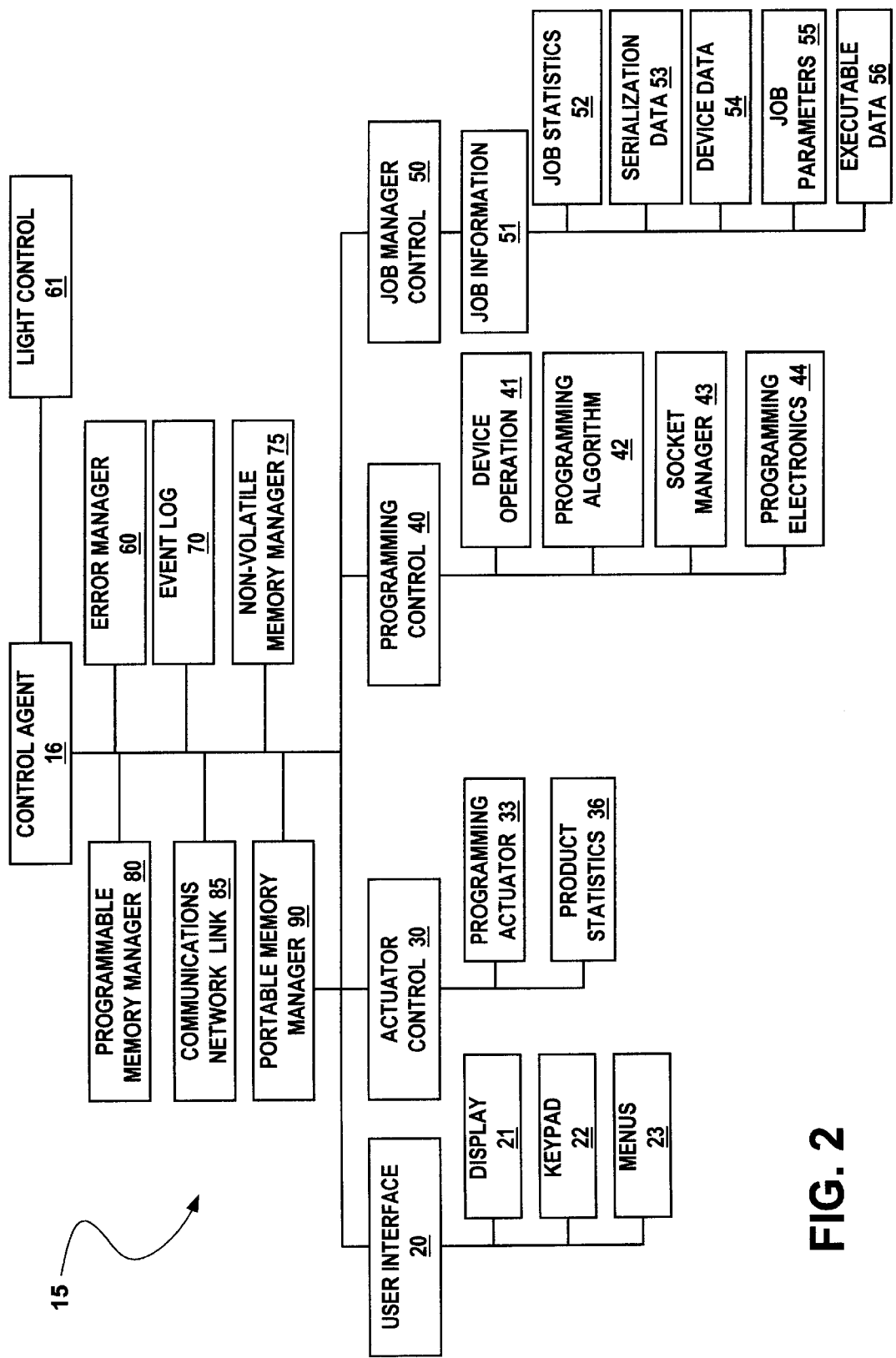
FIG. 2 is an overall schematic of the control system of the present invention.

Referring now to FIG. 2, therein is shown the control system 15 which controls the operations of the programming system 10. The control system 15 is controlled by a control agent 16, which is called a control agent since it sits over other components and subsystems for performing various subsystem operations.

The control agent 16 is connected to a user interface subsystem 20 which allows a user to input instructions regarding setup, to respond to warnings, and to start/stop the operation of the programming system 10. The user interface subsystem 20 further is interconnected to a display 21, a keypad 22, and a plurality of menu selectors 23 which step the user through the setup and the changing of various functions and/or parameters.

The control agent 16 is further connected to an actuator control subsystem 30. The actuator control subsystem 30 operates a programming actuator unit 33, and a product statistics unit 36.

Unprogrammed microdevices are placed in the programming mechanism 13 by a user. The programming actuator unit 33 operates a mechanism which opens the sockets for easy and accurate placement of unprogrammed programmable devices therein and then closes the sockets to couple the unprogrammed programmable devices to the programming mechanism 13 through the sockets.

After programming, the programming actuator unit 33 causes the programmed programmable devices to be released from the sockets so that the user can remove the programmed programmable devices from the programming mechanism 13. Defective programmable devices which can not be programmed are noted by the user and placed in a reject bin (not shown).

The product statistics unit 36 keeps track of how long the programming system 10 has been turned on, and the total number of programmable devices that have been programmed.

The control agent 16 is further connected to a programming control subsystem 40 which controls the programming mechanism 13. The programming control subsystem 40 is connected to a device operation unit 41, a programming algorithm unit 42, a socket manager unit 43, and a programming electronics unit 44.

The device operation unit 41 sets up the power and ground required for the programmable device. The programming algorithm unit 42 determines the particular programmable device being programmed and its operational requirements. The socket manager unit 43 provides information for the programming algorithm unit 42 and the programming electronics unit 44 for the purpose of functionally enabling and disabling individual sockets; if there is a problem with the socket, the units will cause the socket to be bypassed. The programming electronics unit 44 provides the programming for the unprogrammed programmable devices.

The control agent 16 is further connected to a job manager control 50 which is responsible for managing a particular job. The information related to the particular job is described in a job information module 51. The job information module 51 is a database which contains the following information: job statistics 52, serialization data 53, device data 54, job parameters 55, and an executable data 56.

The job statistics 52 relate to the programmable devices that have been programmed, such as how many good programmable devices, how many rejects, what type of failures, yield, and any other information desired about the programming of those programmable devices. Where the programmable devices, such as microprocessors, might have serial numbers, the serialization information is part of the serialization data 53. The device data 54 contains data regarding the programmable device itself. The job parameters 55 consist of the operations to be done, such as whether a part is to be erased, a continuity test is to be performed an illegal bit check is to be made, or a verification of the programmable device to be performed after programming, etc.

The executable data 56 is the set of instructions for the program in which data is programmed into the programmable device. The executable data 56 controls all the pin electronics associated with the programming. It appears under the job information module 51 because it is loaded into the control system 15 as part of the job parameters 55, but the executable data 56 is actually executed by programming algorithm unit 42 of the programming control subsystem 40.

The control agent 16 is further connected to an error manager 60 which manages errors in the programming system 10 and also further is connected to a light control 61. If something goes wrong, the error manager 60 uses the user interface subsystem 20 to control a series of lights, two for each socket, through the light control 61 using green and red or blue lights for "pass" and "fail", respectively. The red light is the old U.S. standard for error and the blue light is the new European standard. If no device is detected in a socket, no light will be lit. The error manager 60 also keeps a list of errors and displays them on the display 21.

The control agent 16 is further connected to an event log 70 which keeps track of the operation of the programming system 10 and records problems with proper operation for warranty and troubleshooting purposes.

The control agent 16 is further connected to a non-volatile memory manager 75 which is for non-volatile random access memory (NVRAM) in the present invention. The non-volatile memory manager 75 contains the system state information and unprocessed statistical information for the programming system 10.

The control agent 16 is further connected to a programmable memory manager 80 which is for an electrically erasable programmable read only memory (EEPROM) in the present invention. The programmable memory manager 80 allows for permanently maintaining a record of the operation of the programming system 10 for diagnostic and troubleshooting purposes.

The control agent 16 is further connected to a communications network link 85, which is an Ethernet connection in the present invention. The communications network link 85 will allow the control system 15 to obtain information required by the job information module 51 from a remote site as well as providing an alternate control to the user interface subsystem 20.

The control agent 16 is further connected to a portable memory manager 90 which is compatible with a PCMCIA file system. The portable memory manager 90 is capable of reading information required by the job information module 51 from a PCMCIA card.

The job statistics 52 are also obtainable by the user through the communications network link 85 or the portable memory manager 90.

Operation

Figure 3:
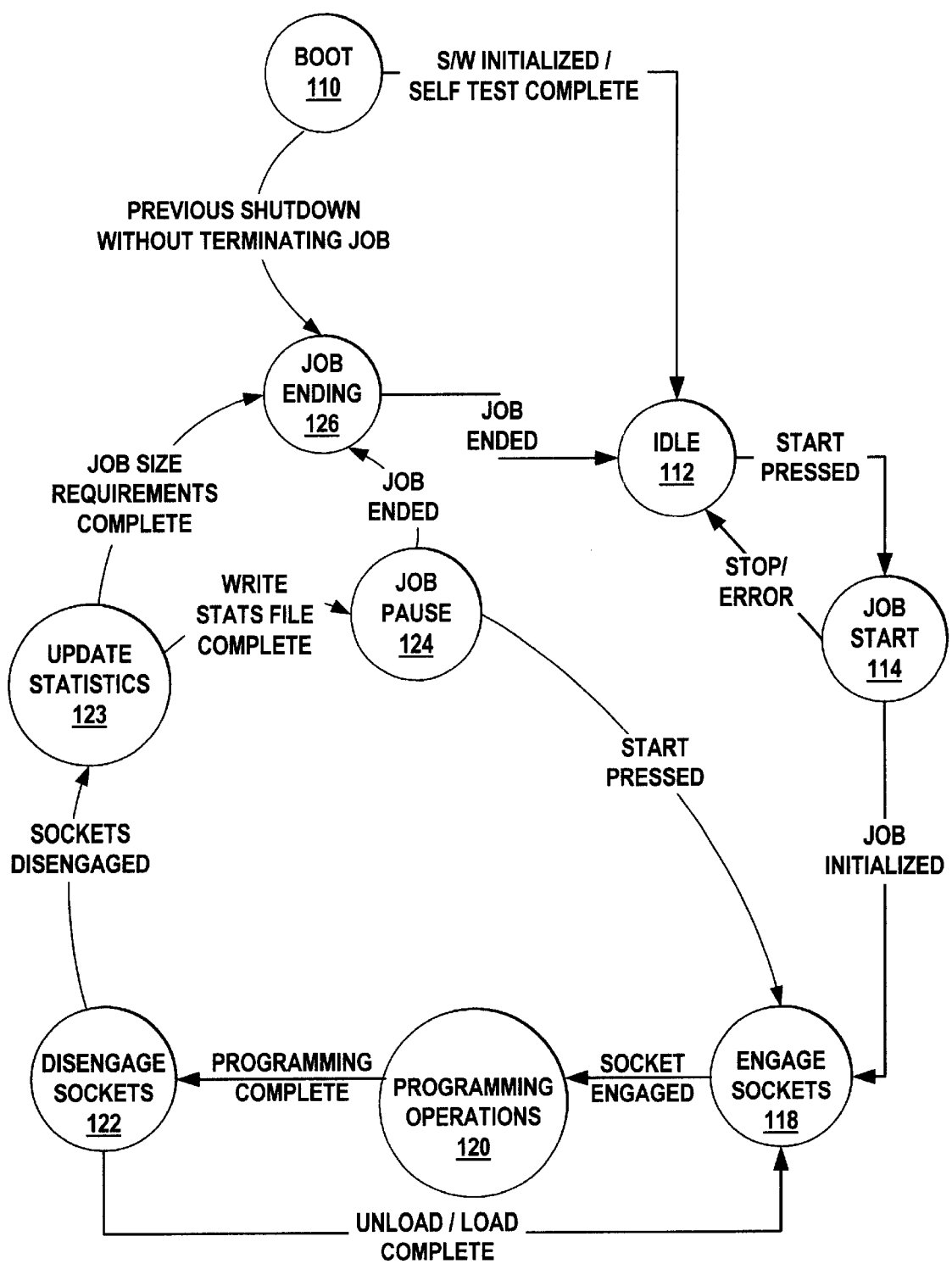
FIG. 3 is a state diagram of the operation of the present invention.

In brief summary, FIGS. 1 and 3 show the hardware and FIG. 2 shows the software. The user interface subsystem 20 interacts with the control agent 16. The control agent 16 controls the actuator control subsystem 30, the programming control subsystem 40 and the job manager control 50. The actuator control subsystem 30 controls the essential operation functions which are the programming actuator unit 33 and the product statistics unit 36. The programming control subsystem 40 controls the programming mechanism 13. The job manager control 50 provides information which relates to performing a job.

In operation, the control agent 16 orchestrates all the systems. The control agent 16 provides primary control over the control system 15 and receives inputs from the user interface subsystem 20. When a user uses the keypad 22 to start a job, the control agent 16 will initialize all of the control system 15 and will notify all systems that a job with the characteristics in the job information module 51 is starting.

The control agent 16 instructs the programming actuator unit 33 to open the sockets to facilitate easy and accurate placement of unprogrammed programmable devices into the programming mechanism 13. After the unprogrammed programmable devices are placed in the sockets, the control agent 16 instructs the programming actuator unit 33 to close the sockets so that the unprogrammed programmable devices are coupled to the programming mechanism 13 through the sockets. The control agent 16 then activates the socket manager unit 43 to functionally enable individual sockets. The programming control subsystem 40 instructs the programming mechanism 13 to start programming the programmable devices.

After the programming is done, the control agent 16 then instructs the actuator control subsystem 30 to have programming actuator unit 33 cause the programmable devices to be released. The user then unloads programmed programmable devices from the programming mechanism 13 and places good programmed devices on an output unit (not shown), which may include a tray, a tube, or a carrier. The bad programmable devices which can not be programmed are noted and placed into a reject bin.

Once the programmed programmable devices are unloaded and placed on the output unit, the user then loads the sockets again with unprogrammed programmable devices. The sequence will then repeat itself.

In an embodiment, a user uses a manual manipulator to pick up four unprogrammed programmable devices sequentially and then places them all at one time into four separate sockets (not shown) in the programming mechanism 13. The programming electronics unit 44 will program the programmable devices. After programming, the user uses the manipulator to pick up the four programmed programmable devices all at one time and deposits the good devices on the output unit and the bad devices in the reject bin. The sequence will then repeat itself.

The control agent 16 also provides information from the error manager 60 to the event log 70 which keeps track of the various events/states that the control system 15 has encountered. The control agent 16 has a series of states and every time it changes state, it records the state that it is entering into the event log 70.

Referring now to FIG. 3, therein is shown a state diagram for the control agent 16. There are nine states.

The first state is the boot state 110. The programming system enters the boot state 110 when power is applied. All the software components are created and initialized, and the hardware input/output (I/O) is set to a known state. All the system components are placed into a known good state and a self-test is performed on each of the subcomponents. The self-test includes checking to see if there are programmable devices in the programming mechanism 13.

The second state, the idle state 112, is entered after completion of the initialization and self-test. The control system 15 waits for an input from the keypad 22 of FIG. 2 or an indication that a job has ended, as will later be explained.

The third state, the job start state 114, is entered when the start is pressed on the keypad 22. At this point, all the data from the user interface subsystem 20, the job parameters 55, the executable data 56, the programmable memory manager 80 information, and the portable memory manager 90 information for the particular job are provided to the programming control subsystem 40.

The fourth state, an engage sockets state 118, is entered after the loading of sockets with unprogrammed programmable devices is complete. In this state, the socket manager unit 43 provides information for the programming algorithm unit 42 and the programming electronics unit 44 to functionally enable individual sockets.

The fifth state, a programming operations 120, is entered when the control agent 16 moves to the programming operations 120, after the sockets are engaged, i.e., functionally enabled by the socket manager unit 43. In this state, the programming control subsystem 40 operates with the programming electronics unit 44 to program the unprogrammed programmable devices. The programming electronics unit 44 programs the programmable devices.

The sixth state, a disengage sockets state 122, is entered when the programming is complete. The socket manager unit 43 causes the sockets to be disengaged, i.e., functionally disabled. The user then puts the defective programmable devices into the reject bin and the good programmable devices onto an output unit, such as a carrier.

The seventh state, update statistics 123, is entered when the disengage sockets state 122 is complete. The job manager control 50 causes the job information module 51 to update the job statistics 52.

The eighth state is when the control agent 16 returns to recycling when the unloading of the programmed programmable devices and the loading of the new unprogrammed programmable devices are complete and returns to the engage sockets state 118 to recycle through the programming operations 120 and the disengage sockets state 122.

The ninth state, a job pause state 124, occurs at any time during the cycle upon an error or a stop command from the user. The job pause state 124 will be maintained until the start is pressed on the keypad 22 by the user. If the user restarts the job, the operation would continue uninterrupted.

A stop due to an error from the state of the programming operations 120 will cause the error manager 60 to cause the light control 61 to illuminate the blue or red light.

When the job size as indicated by the job parameters 55 is reached, the job ending state 126 is entered, and then the idle state 112 is then resumed, and similarly, if the job is stopped prematurely.

If the previous job had been ended by shutting off power before the job was completed, the control system 15 will go immediately to the job ending state 126 and then to the idle state 112 to clean up any job in process before proceeding with a new job.

From the above it will be understood that the present invention is applicable to what can be described as "microdevices". Microdevices include a broad range of electronic and mechanical devices. The best mode describes processing which is programming for programmable devices, which include but are not limited to devices such as Flash memories (Flash), electrically erasable programmable read only memories ($E^2PROM$), programmable logic devices (PLDs), field programmable gate arrays (FPGAs), and microcontrollers. However, the present invention encompasses processing for all electronic, mechanical, hybrid and other devices which require testing, measurement of device characteristics, calibration, and other processing operations. For example, these types of microdevices would include but not be limited to devices such as microprocessors, integrated circuits (ICs), application specific integrated circuits (ASICs), micromechanical machines, micro-electro-mechanical (MEMs) devices, micromodules, and fluidic systems.

Further, the invention and parts thereof may be implemented in hardware, firmware, software, or combinations thereof.

While the invention has been described in conjunction with a specific best mode, it is to be understood that many alternatives, modifications, and variations will be apparent to those skilled in the art in light of the a foregoing description. Accordingly, it is intended to embrace all such alternatives, modifications, and variations which fall within the spirit and scope of the included claims. All matters hither-to-fore set forth or shown in the accompanying drawings are to be interpreted in an illustrative and non-limiting sense.

The invention claimed is:

1. A control system for a system having a processing mechanisms for processing a microdevice, comprising:

a control agent;

an interface connected to communicate instructions to and from the control agent;

a processing control subsystem responsive to the control agent to control the processing mechanism to process the microdevice;

a job manager control connected to the control agent capable of communicating information with the processing control subsystem related to the microdevice;

an event log capable of maintaining information related to the operations of the control agent;

a fist memory manager for containing randomly accessible information of the processing control subsystem;

a second memory manager for maintaining a permanent record of the operation of the processing control subsystem; and a third memory manager for providing removable information for the job manager control to communicate to the processing control subsystem.

2. The control system as claimed in claim 1 including:

an error manager capable of responding to an error signal from the system to provide an indication thereof.

3. The control system as claimed in claim 1 wherein the first memory manager comprises:

a non-volatile memory manager for maintaining information related to the processing control subsystem and unprocessed statistical information relating to the microdevice.

4. The control system as claimed in claim 1 wherein the second memory manager comprises:

a programmable memory manager for permanently recording information related to the processing control subsystem.

5. The control system as claimed in claim 1 including:

a communications network link capable of providing information to and from the control agent.

6. The control system as claimed in claim 1 wherein the third memory manager comprises:

a portable memory manager for communicating job information to the control agent; and a portable memory for removing the job information from the control system.

7. The control system as claimed in claim 1 wherein:

the processing control subsystem is capable of controlling the processing of the microdevice using the removable information with a process selected from a group consisting of programming, calibration, test, and measurement.

8. The control system as claimed in claim 1 including:

a processing mechanism manager unit capable of enabling and disabling the processing mechanism in response to a fault therein.

9. A method for controlling a system having a microdevice processing, mechanism, comprising:

providing a control agent;

communicating instructions to and from the control agent to an interface connected thereto;

controlling the processing mechanism to process the microdevice using a processing control subsystem responsive to the control agent;

communicating information with the processing control subsystem related to the microdevice using a job manager control connected to the control agent;

maintaining information related to the operations of the control agent using an event log;

containing randomly accessible information of the processing control subsystem;

maintaining a permanent record of the operation of the processing control subsystem; and providing removable information for the job manager control to communicate to the processing control subsystem.

10. The method for controlling a system as claimed in claim 9 including:

providing an indication of errors from the processing control subsystem using an error manager capable of receiving signals from the control agent.

11. The method for controlling a system as claimed in claim 9 wherein containing the randomly accessible information comprises:

maintaining information related to the processing control subsystem using a non-volatile memory manager and unprocessed statistical information relating to the microdevice.

12. The method for controlling a system as claimed in claim 9 wherein maintaining a permanent record comprises:

recording information related to the processing control subsystem using a programmable memory manager.

13. The method for controlling a system as claimed in claim 9 including:

providing information to and from the control agent using a communications network link.

14. The method for controlling a system as claimed in claim 9 wherein providing removable information comprises:

communicating information with a portable memory removable from the system and communicating the information to the control agent using the portable memory.

15. The method for controlling a system as claimed in claim 9 wherein:

controlling the processing of the microdevice using the removable information with a process selected from a group consisting of programming, calibration, test, and measurement using the processing control subsystem.

16. The method for controlling a system as claimed in claim 9 including:

a processing mechanism manager unit capable of selectively enabling and disabling portions of the processing mechanism in response to a fault therein.

* * * * *

UNITED STATES PATENT AND TRADEMARK OFFICE
CERTIFICATE OF CORRECTION

PATENT NO.     : 6,671,564 B1
DATED          : December 30, 2003
INVENTOR(S)    : Johnson et al.

It is certified that error appears in the above-identified patent and that said Letters Patent is hereby corrected as shown below:

<u>Title page,</u>
Item [*] Notice, delete "273 days" and insert therefore -- 365 days --

<u>Column 8,</u>
Line 12, delete "fist" and insert -- first --

Signed and Sealed this

Twenty-third Day of March, 2004

JON W. DUDAS
*Acting Director of the United States Patent and Trademark Office*